US012713573B2

(12) United States Patent
Senga et al.

(10) Patent No.: US 12,713,573 B2
(45) Date of Patent: Aug. 18, 2026

(54) MOUNTING APPARATUS, MOUNTING METHOD, AND METHOD FOR MEASURING HEIGHT OF SUBSTRATE

(71) Applicant: FUJI CORPORATION, Chiryu (JP)

(72) Inventors: Akihiro Senga, Okazaki (JP); Takayuki Mizuno, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 666 days.

(21) Appl. No.: 18/249,297

(22) PCT Filed: Nov. 26, 2020

(86) PCT No.: PCT/JP2020/044042
§ 371 (c)(1),
(2) Date: Apr. 17, 2023

(87) PCT Pub. No.: WO2022/113241
PCT Pub. Date: Jun. 2, 2022

(65) Prior Publication Data
US 2023/0397386 A1 Dec. 7, 2023

(51) Int. Cl.
*H05K 13/08* (2006.01)
*G01B 5/06* (2006.01)
*H05K 13/04* (2006.01)

(52) U.S. Cl.
CPC ........... *H05K 13/082* (2018.08); *G01B 5/061* (2013.01); *H05K 13/04* (2013.01)

(58) Field of Classification Search
CPC .. H05K 13/082; H05K 13/04; H05K 13/0882; H05K 13/089; H05K 13/0409; G01B 5/061
See application file for complete search history.

(56) References Cited

U.S. PATENT DOCUMENTS

2006/0207090 A1* 9/2006 Kawada ............. H05K 13/0409 29/832
2009/0293265 A1* 12/2009 Inoue .................. H05K 13/082 29/739
(Continued)

FOREIGN PATENT DOCUMENTS

JP 2000269692 A * 9/2000
JP 2000-299597 A 10/2000
(Continued)

OTHER PUBLICATIONS

International Search Report issued Feb. 9, 2021 in PCT/JP2020/044042 filed on Nov. 26, 2020, 2 pages.

*Primary Examiner* — Thomas J Hong
*Assistant Examiner* — Jose K Abraham
(74) *Attorney, Agent, or Firm* — Oblon, McClelland, Maier & Neustadt, L.L.P.

(57) ABSTRACT

A mounting apparatus includes a lifting and lowering device that lifts and lowers a holding member holding a component with respect to a substrate, a contact detection section that detects contact between the holding member or a component held by the holding member and the substrate, and a control section that sets a mounting height of the component in accordance with a height of the substrate, causes the holding member holding the component to be lowered to the mounting height by the lifting and lowering device, and releases holding of the component to mount the component when the contact is detected, in which the control section acquires a height of the holding member when the holding member is lowered by the lifting and lowering device and the contact is detected, and measures the height of the substrate based on the height of the holding member.

8 Claims, 12 Drawing Sheets

(56) References Cited

U.S. PATENT DOCUMENTS

| | | | | |
|---|---|---|---|---|
| 2018/0199478 | A1* | 7/2018 | Yamazaki ............ | H05K 13/086 |
| 2019/0024813 | A1* | 1/2019 | Ito .......................... | H05K 13/08 |
| 2019/0104658 | A1* | 4/2019 | Hara .................... | H05K 13/082 |

FOREIGN PATENT DOCUMENTS

| | | | |
|---|---|---|---|
| JP | 2009-27015 | A | 2/2009 |
| JP | 2012-94673 | A | 5/2012 |
| JP | 2019-158626 | A | 9/2019 |

* cited by examiner

UP
FRONT
REAR
DOWN
10A
12
40A
50A
S
50B
40B
28
60A
28
60B
16
26
14
14
26
16
11A
11B

MOUNTING APPARATUS, MOUNTING METHOD, AND METHOD FOR MEASURING HEIGHT OF SUBSTRATE

TECHNICAL FIELD

The present specification discloses a mounting apparatus, a mounting method, and a method for measuring a height of a substrate.

BACKGROUND ART

Conventionally, in a mounting apparatus for mounting a component on a substrate, an apparatus for measuring a height of a substrate, which is a height of a upper surface of the substrate, has been proposed (refer to Patent Literature 1, for example). The mounting apparatus is provided with a sensor such as a laser-type displacement sensor, measures the height of the substrate with the sensor at a timing when a substrate is first carried in, and mounts a component on the substrate based on a stroke determined from the height of the substrate.

PATENT LITERATURE

Patent Literature 1: JP-A-2009-27015

BRIEF SUMMARY

Technical Problem

In the above-described mounting apparatus, since a sensor dedicated to measuring the height of the substrate is provided, the cost is increased. In addition, in a laser displacement sensor, when laser light hits a boundary portion of an electrode or a wiring formed on the substrate, the degree of reflection or scattering changes, so that the height of the substrate may be misrecognized.

It is a principal object of the present disclosure to accurately measure a height of a substrate while suppressing an increase in cost.

Solution to Problem

The present disclosure employs the following means in order to achieve the above-described principal object.

The mounting apparatus of the present disclosure includes a lifting and lowering device configured to lift and lower a holding member holding a component with respect to a substrate, a contact detection section configured to detect contact between the holding member or a component held by the holding member and the substrate, and a control section that sets a mounting height of the component in accordance with a height of the substrate, causes the holding member holding the component to be lowered to the mounting height by the lifting and lowering device, and releases holding of the component to mount the component when the contact is detected, in which the control section acquires a height of the holding member when the holding member is lowered by the lifting and lowering device and the contact is detected, and measures the height of the substrate based on the height of the holding member.

In the mounting apparatus of the present disclosure, the height of the holding member is acquired when the holding member is lowered by the lifting and lowering device and the contact is detected, and measures the height of the substrate by deriving the height of a contact position based on the height of the holding member. As a result, since the height of the substrate can be measured using the contact detection section configured to detect the contact of the component with the substrate when the component is mounted, the height of the substrate can be accurately measured without being affected by the reflection of light or the like. In addition, since it is not necessary to add a dedicated detection section for measuring the height of the substrate, it is possible to suppress an increase in cost.

BRIEF DESCRIPTION OF DRAWINGS

FIG. 4 is an explanatory diagram illustrating a state where a circulation state of air is switched.

DESCRIPTION OF EMBODIMENTS

Figure 1:
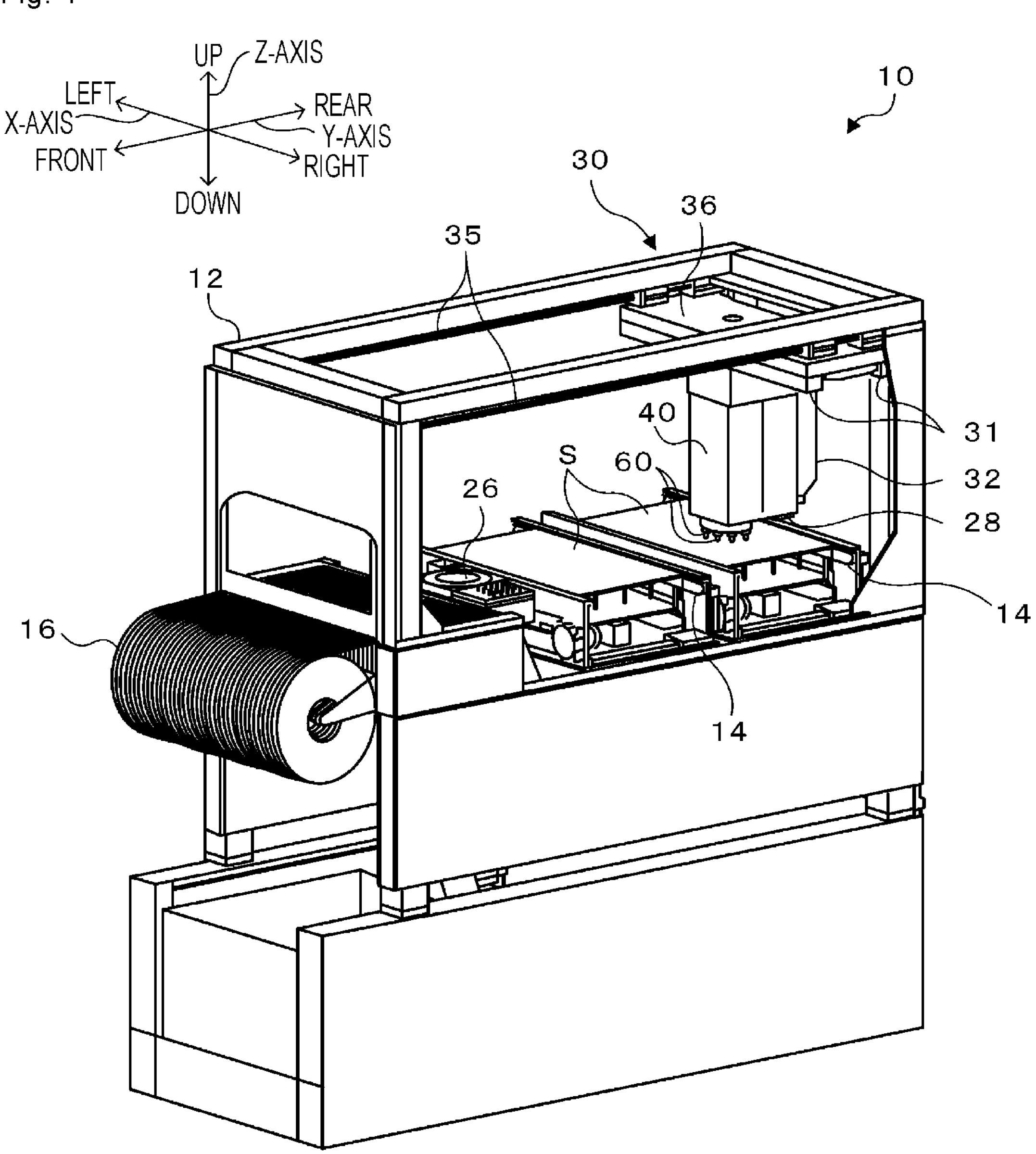
FIG. 1 is a configuration diagram schematically illustrating a configuration of mounting apparatus 10.
Figure 2:
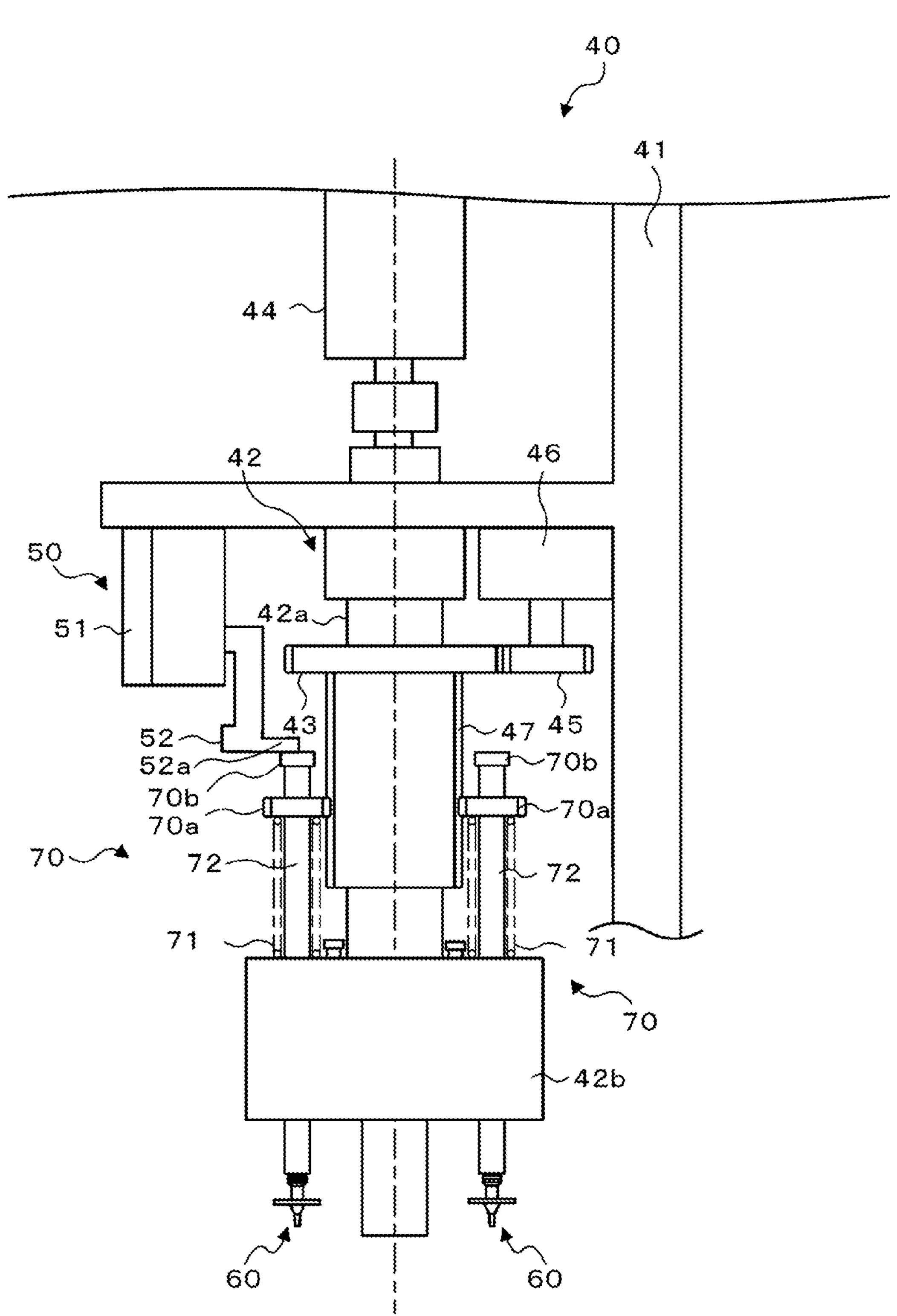
FIG. 2 is a configuration diagram schematically illustrating a configuration of mounting head 40.
Figure 3:
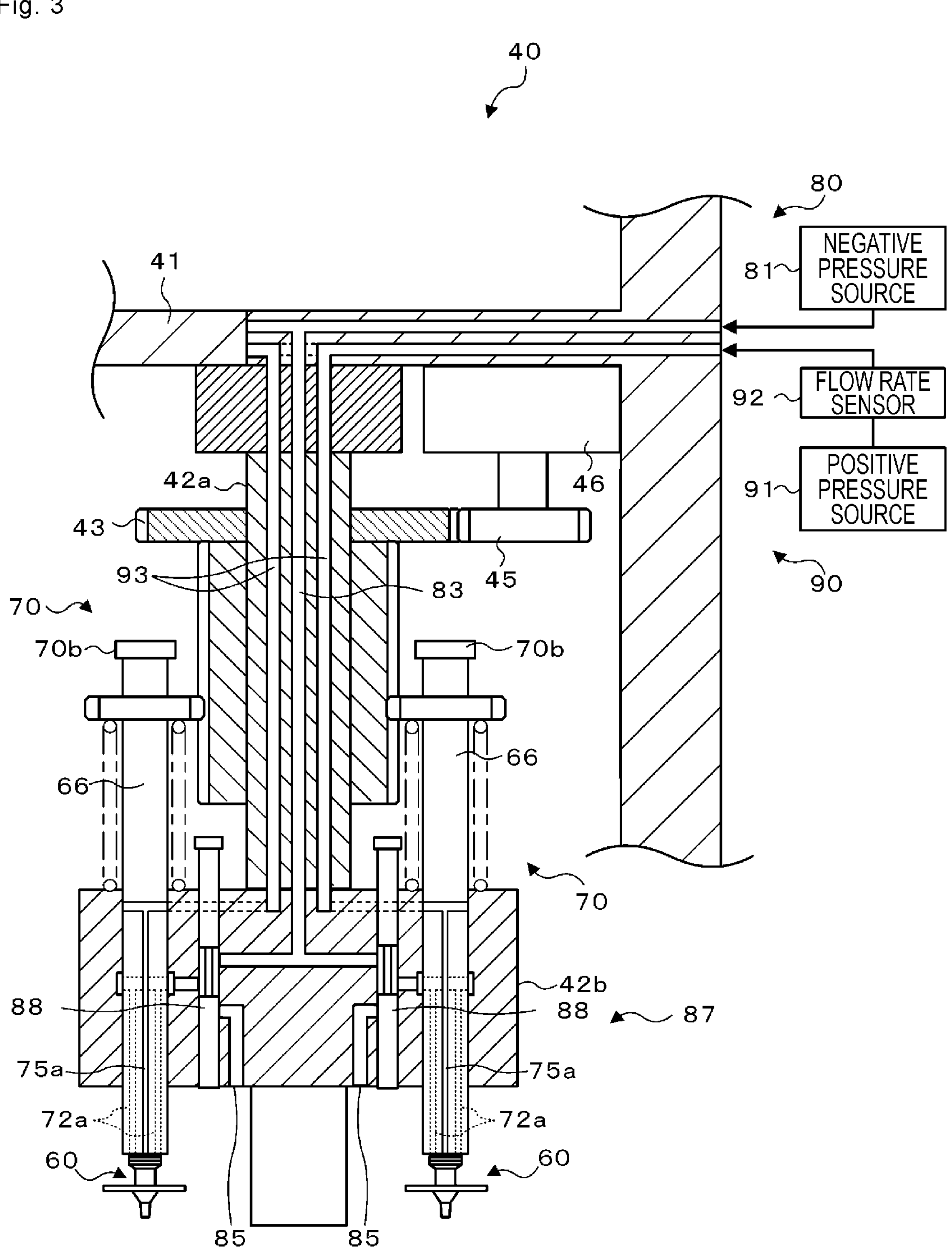
FIG. 3 is a configuration diagram schematically illustrating a configuration of mounting head 40.
Figure 5:
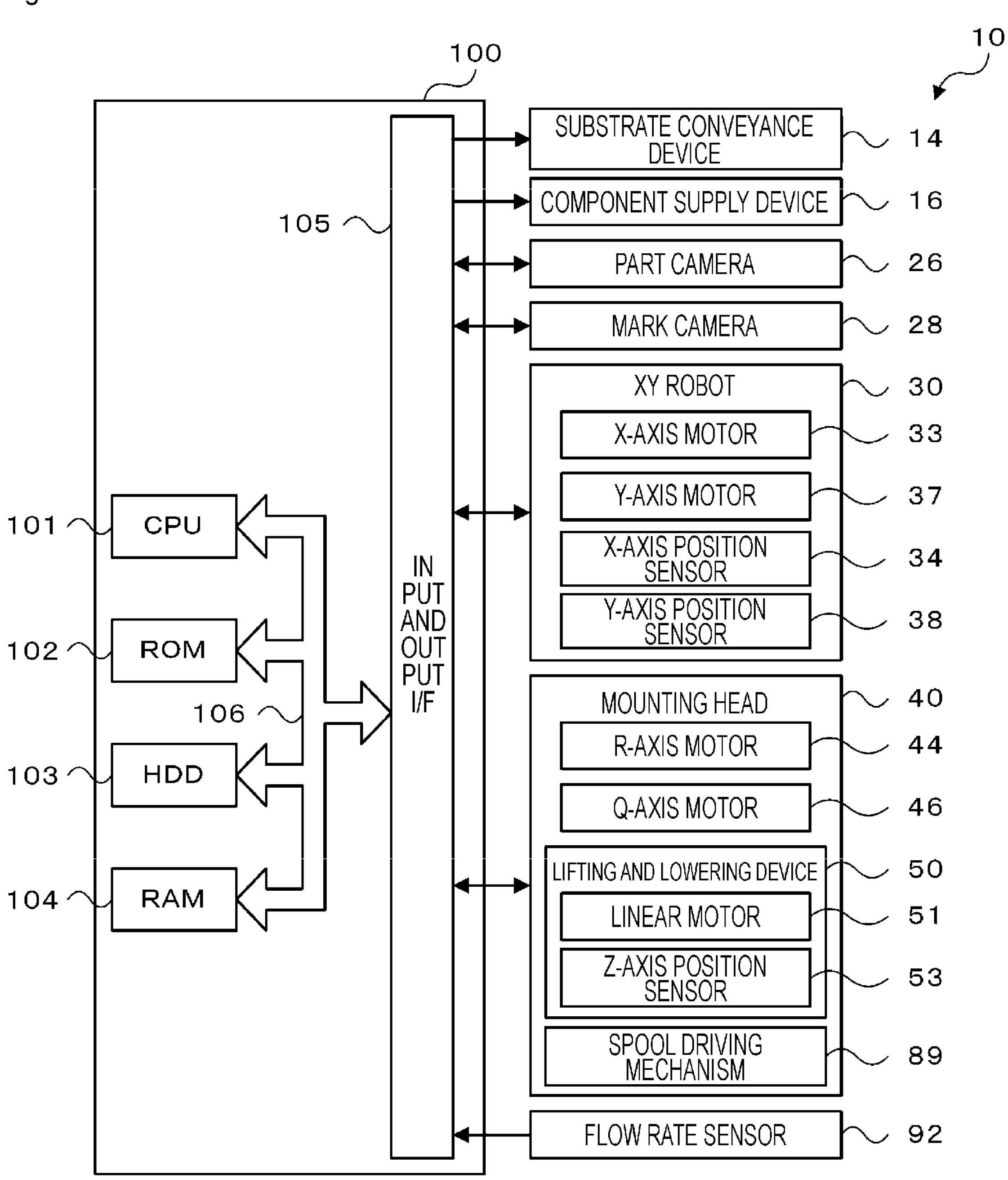
FIG. 5 is an explanatory diagram illustrating an electrical connection relationship of mounting apparatus 10.

Next, embodiments of the present disclosure will be described with reference to the accompanying drawings. FIG. 1 is a configuration diagram schematically illustrating a configuration of mounting apparatus 10. FIGS. 2 and 3 are configuration diagrams schematically illustrating a configuration of mounting head 40. FIG. 4 is an explanatory diagram illustrating a state where a circulation state of air is switched. FIG. 5 is an explanatory diagram illustrating an electrical connection relationship of mounting apparatus 10. In FIG. 1, a right-left direction is an X-axis direction, a front-rear direction is a Y-axis direction, and an up-down direction is a Z-axis direction.

As illustrated in FIG. 1, mounting apparatus 10 is provided with substrate conveyance device 14, component supply device 16, XY robot 30, mounting head 40, and control device 100 (refer to FIG. 5). Substrate conveyance device 14 conveys substrate S from the left to the right by two sets of conveyor units provided in the front-rear direction. Component supply device 16 is configured as a tape feeder for supplying a component by feeding a tape in which accommodation sections for accommodating the components are formed for each predetermined interval. In addition to these devices, mounting apparatus 10 is provided with part camera 26 that captures an image of the component picked up by mounting head 40 from below, mark camera 28 that is provided in mounting head 40 to capture an image of a reference mark or the like attached to substrate S from above, and the like.

XY robot 30 is provided with X-axis slider 32 and Y-axis slider 36. Y-axis slider 36 is spanned by a pair of left and right Y-axis guide rails 35 provided along the front-rear direction (Y-axis direction) at an upper stage portion of main body frame 12, and moves along Y-axis guide rail 35 by driving Y-axis motor 37 (refer to FIG. 5). X-axis slider 32 is attached to X-axis guide rail 31 provided on a lower surface of Y-axis slider 36 along the left-right direction (X-axis direction), and moves along X-axis guide rail 31 by driving X-axis motor 33 (refer to FIG. 5). XY robot 30 can move mounting head 40 to a predetermined position on the XY-plane by the movement of X-axis slider 32 and Y-axis slider 36.

As illustrated in FIGS. 2 and 3, mounting head 40 is provided with frame 41 attached to X-axis slider 32, head main body 42 in which multiple nozzle holders 70 are disposed at intervals of a predetermined angle (for example, 30 degrees) in the circumferential direction, and suction nozzle 60 attached to each nozzle holder 70. In addition, mounting head 40 is provided with R-axis motor 44 that rotates head main body 42 to rotate (revolve) multiple nozzle holders 70, Q-axis motor 46 that rotates multiple nozzle holders 70, and lifting and lowering device 50 that lifts and lowers nozzle holder 70. In addition, mounting head 40 is provided with negative pressure supply device 80 which supplies negative pressure to suction nozzle 60, and positive pressure supply device 90 which supplies positive pressure to nozzle holder 70.

Head main body 42 is provided with shaft section 42*a* rotatably supported by frame 41, and holder holding portion 42*b* formed in a columnar shape having a larger diameter than that of shaft section 42*a* and holding multiple nozzle holders 70 so as to be able to lift and lower in the Z-axis direction. When R-axis motor 44 is driven, shaft section 42*a* and holder holding portion 42*b* rotate, so that multiple nozzle holders 70 rotate (revolve). In addition, head main body 42 includes gear 43 coaxial with shaft section 42*a* and rotatably supported relative to shaft section 42*a*, and gear 47 that rotates in conjunction with the rotation of gear 43. Gear 43 meshes with gear attached to a rotary shaft of Q-axis motor 46, and gear 47 meshes with gear 70*a* attached to each nozzle holder 70. When Q-axis motor 46 is driven, both each nozzle holder 70 and suction nozzle 60 attached to each nozzle holder 70 rotate by the same amount of rotation (rotation angle) in the same rotation direction. In addition, spring 71 is disposed between a lower surface of gear and an upper surface of holder holding portion 42*b*. Spring 71 biases nozzle holder 70 upward in the Z-axis direction. Nozzle holder 70 is a cylindrical member, and first air passage 72*a* and second air passage 75*a* are formed inside nozzle holder 70.

As illustrated in FIG. 2, lifting and lowering device 50 is provided with linear motor 51 and Z-axis slider 52 that can be lifted and lowered in the Z-axis direction by driving linear motor 51. Engaging section 52*a* that can engage (abut) with upper end portion 70*b* of nozzle holder 70 is formed on Z-axis slider 52. Lifting and lowering device 50 lifts and lowers nozzle holder 70 by lifting and lowering Z-axis slider 52 in a state where engaging section 52*a* is engaged with upper end portion 70*b* of nozzle holder 70 located at a predetermined lifting and lowering position among multiple nozzle holders 70. As a result, suction nozzle 60 also is lifted and lowered. Multiple nozzle holders 70 are revolved by driving R-axis motor 44, so that multiple nozzle holders 70 subsequently move to the lifting and lowering positions.

Negative pressure supply device 80 is a device for supplying negative pressure from negative pressure source 81 such as a vacuum pump to each of multiple suction nozzles 60 attached to multiple nozzle holders 70. As illustrated in FIG. 3, negative pressure supply device 80 is provided with negative pressure source 81, negative pressure introduction passage 83, atmosphere introduction passage 85, and switching valve 87. Multiple switching valves 87 are provided corresponding to each of multiple nozzle holders 70. Negative pressure introduction passage 83 is connected to negative pressure source 81, extends radially from the center of holder holding portion 42*b* through the inside of frame 41 and the center of shaft section 42*a*, and is formed so as to communicate with first air passage 72*a* of each nozzle holder 70 via switching valve 87. Multiple atmosphere introduction passages 85 are formed so as to open at a lower end of holder holding portion 42*b* to communicate with the positive pressure source (atmosphere), to pass through holder holding portion 42*b*, and to communicate with first air passage 72*a* of each nozzle holder 70 via switching valve 87. Switching valve 87 is provided with shaft-shaped spool 88 inserted into a spool hole passing through holder holding portion 42*b* in the up-down direction and having a diameter-reducing section substantially at the center, and spool driving mechanism 89 (refer to FIG. 5) for moving spool 88 in the up-down direction. Switching valve 87 is capable of circulating air around the diameter-reducing section of spool 88 in the spool hole, and selectively switches which of negative pressure introduction passage 83 and atmosphere introduction passage 85 is caused to communicate with first air passage 72*a* by moving spool 88 in the up-down direction. Spool driving mechanism 89 is configured to, for example, include a mechanism for raising and lowering a lever (not illustrated) attached to spool 88.

Positive pressure supply device 90 is a device for supplying positive pressure from positive pressure source 91 such as a compressor to second air passage 75*a* provided in each of multiple nozzle holders 70. As illustrated in FIG. 3, positive pressure supply device 90 is provided with positive pressure source 91, flow rate sensor 92, and positive pressure introduction passage 93. Flow rate sensor 92 is a sensor for detecting the presence or absence of the circulation of air in second air passage 75*a*. As described later, based on the detection of the circulation of air by flow rate sensor 92, the contact between suction nozzle 60 or a component picked up by suction nozzle 60 and substrate S can be detected. Positive pressure introduction passage 93 is connected to positive pressure source 91 via flow rate sensor 92, extends outside in the radial direction in holder holding portion 42*b* through the inside of frame 41 and the inside of shaft section 42*a*, and is formed so as to communicate with second air passage 75*a*.

Details of the configurations of nozzle holder 70 and suction nozzle 60 will be described with reference to FIG. 4. FIG. 4A illustrates a state where suction nozzle 60 is not pushed into nozzle holder 70 side, and FIG. 4B illustrates a state where suction nozzle 60 is pushed into nozzle holder 70 side. Suction nozzle 60 is provided with hollow nozzle section 61, retaining ring 62 having the inner diameter larger than the outer diameter of nozzle section 61, and pin 63. Nozzle section 61 can pick up the component by supplying negative pressure to internal passage 61*a*. In nozzle section 61, multiple through-holes 61*b* penetrating in the up-down direction are formed at equal intervals on the circumference at the upper end, and a pair of long holes 61*c* penetrating in the radial direction is formed in the side wall. Nozzle section 61 is slidably inserted in the up-down direction, a flange section is formed at a lower end of retaining ring 62, and a pair of through-holes penetrating in the radial direction is formed in a side wall of retaining ring 62. Pin 63 is disposed so as to penetrate through the pair of long holes 61*c* of nozzle section 61 and the pair of through-holes of retaining ring 62 in the radial direction (left-right direction in FIG. 4), and is held so as to be movable up and down with respect to the pair of long holes 61*c* and not to be movable up and down with respect to the pair of through-holes of retaining ring 62. Therefore, pin 63 holds nozzle section 61 so as to prevent nozzle section 61 from falling off from retaining ring 62 while allowing nozzle section 61 to move up and down relative to retaining ring 62.

Nozzle holder 70 is provided with outer cylinder 72, pressing ring 73, spring 74, inner cylinder 75, spring 76, and valve 77. Outer cylinder 72 has suction nozzle 60 attached to a lower end thereof and inner cylinder 75 inserted inside outer cylinder 72, and a gap extending in a cylindrical manner in the up-down direction between an inner peripheral surface and an outer peripheral surface of inner cylinder 75 is formed as first air passage 72*a* described above. In addition, outer cylinder 72 is formed with leak hole 72*b* extending in the radial direction through a side wall on the upper side of suction nozzle 60. Pressing ring 73 has the inner diameter larger than the outer diameter of outer cylinder 72, and outer cylinder 72 is inserted into the inside of pressing ring 73. Spring 74 biases an upper end surface of pressing ring 73 downward by using a protrusion formed on an outer peripheral surface of outer cylinder 72 as a spring receiver. Although not illustrated, an inverted L shaped slit extending upward from a lower end and bent in the circumferential direction is formed in outer cylinder 72. When suction nozzle 60 is attached to nozzle holder 70, suction nozzle 60 is inserted into outer cylinder 72 so that pin 63 enters the slit of outer cylinder 72, and then suction nozzle 60 is revolved in the circumferential direction, so that pin 63 moves to the extension end of the slit and is engaged with the slit. In this state, pressing ring 73 presses pin 63 protruding outward from outer cylinder 72 from above by the biasing force of spring 74, so that pin 63 is prevented from coming off the slit of outer cylinder 72 to hold suction nozzle 60.

Inner cylinder 75 is a cylindrical member with a bottom whose lower end is closed, forms an internal space extending in the up-down direction as second air passage 75*a* described above, and includes flange section 75*b* and opening 75*d*. Flange section 75*b* protrudes from the outer peripheral surface, abuts on to be engaged with a portion where the inner peripheral surface of outer cylinder 72 is further narrowed from below, and restrains the movement of inner cylinder 75 with respect to outer cylinder 72. In flange section 75*b*, multiple through-holes 75*c* penetrating in the up-down direction are formed at equal intervals on the circumference in the top view. Opening 75*d* penetrates inner cylinder 75 in the radial direction.

Valve 77 is a cylindrical switching valve disposed between outer cylinder 72 and inner cylinder 75 and that switches whether leak hole 72*b* of outer cylinder 72 and opening 75*d* of inner cylinder 75 are in communication. Valve 77 is formed to have the outer diameter that can slide on an inner peripheral surface of outer cylinder 72 and the inner diameter that can slide on an outer peripheral surface of inner cylinder 75, and a lower end thereof abuts on an upper end of nozzle section 61 to be lifted and lowered integrally with nozzle section 61 in the up-down direction. Valve 77 is formed with through-hole 77*a* that penetrates in the up-down direction, and communicating hole 77*b* that penetrates in the radial direction and can communicate second air passage 75*a* (opening 75*d*) in inner cylinder 75 with leak hole 72*b* of outer cylinder 72. The upper end of through-hole 77*a* communicates with first air passage 72*a* and the lower end thereof communicates with through-hole 61*b* of nozzle section 61, so that the negative pressure or the positive pressure (atmosphere) supplied from first air passage 72*a* is introduced into internal passage 61*a* by through-hole 77*a* and through-hole 61*b*. Spring 76 biases valve 77 and nozzle section 61 downward by using a protrusion formed on the outer peripheral surface of inner cylinder 75 as a spring receiver.

Figures 4A, 4B:
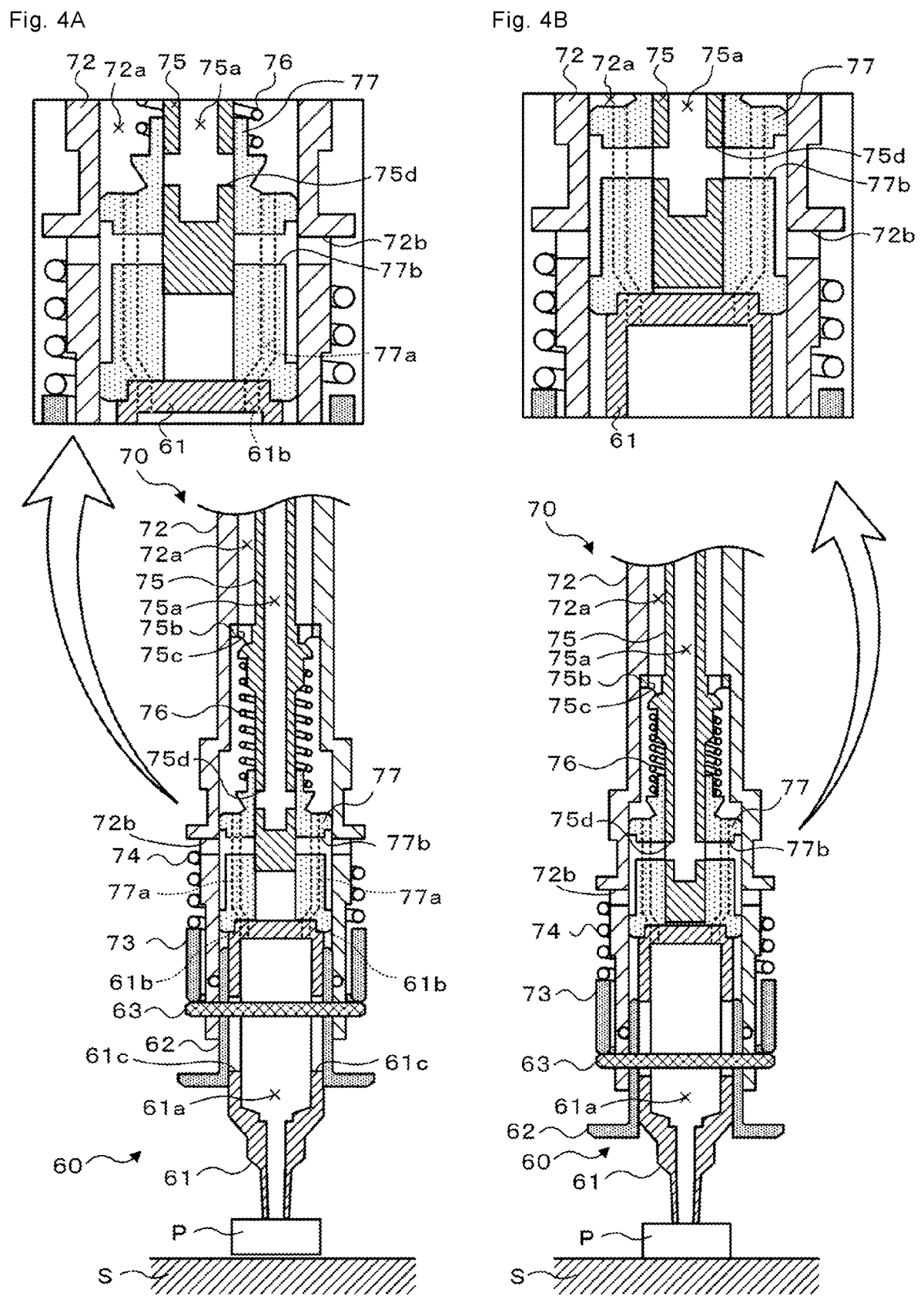

In a state where the component picked up by nozzle section 61 is not in contact with substrate S, valve 77 is pressed downward by the biasing force of spring 76 to enter a state illustrated in FIG. 4A. In this state, the positions of communicating hole 77*b* of valve 77 and opening 75*d* of inner cylinder 75 deviates in the up-down direction. Therefore, valve 77 shuts off the communication between leak hole 72*b* and opening 75*d*. Accordingly, since the positive pressure supplied from positive pressure source 91 does not flow from second air passage 75*a* to the outside, flow rate sensor 92 does not detect the circulation of air and does not detect the contact. On the other hand, when nozzle holder 70 is lowered by lifting and lowering device 50 so that the component picked up by nozzle section 61 contacts substrate S, nozzle section 61 is pushed upward (nozzle holder 70 side) against the biasing force of spring 76. When the pushed-in amount reaches a predetermined amount, a state in FIG. 4B is entered. In this state, since leak hole 72*b* of outer cylinder 72 and opening 75*d* of inner cylinder 75 communicate with each other by communicating hole 77*b* of valve 77, air (positive pressure) supplied from positive pressure source 91 to second air passage 75*a* flows from leak hole 72*b* to the outside. Therefore, flow rate sensor 92 can detect the circulation of the air in second air passage 75*a* to detect the contact between the component and substrate S.

As illustrated in FIG. 5, control device 100 is configured as a microprocessor centered on CPU 101, and is provided with ROM 102, HDD 103, RAM 104, input and output interface 105, and the like, in addition to CPU 101. These components are connected to each other via bus 106. Image signals from part camera 26 and mark camera 28, each detection signal from X-axis position sensor 34 that detects the position of X-axis slider 32, Y-axis position sensor 38 that detects the position of Y-axis slider 36, and Z-axis position sensor 53 that detects the position of Z-axis slider 52, a detection signal from flow rate sensor 92, and the like are input to control device 100 via input and output interface 105. On the other hand, control signals to substrate conveyance device 14 and component supply device 16, drive signals to XY robot 30 (X-axis motor 33 and Y-axis motor 37), drive signals to mounting head 40 (R-axis motor 44, Q-axis motor 46, linear motor 51, spool driving mechanism 89), and the like are output from control device 100 through input and output interface 105.

Figure 6:
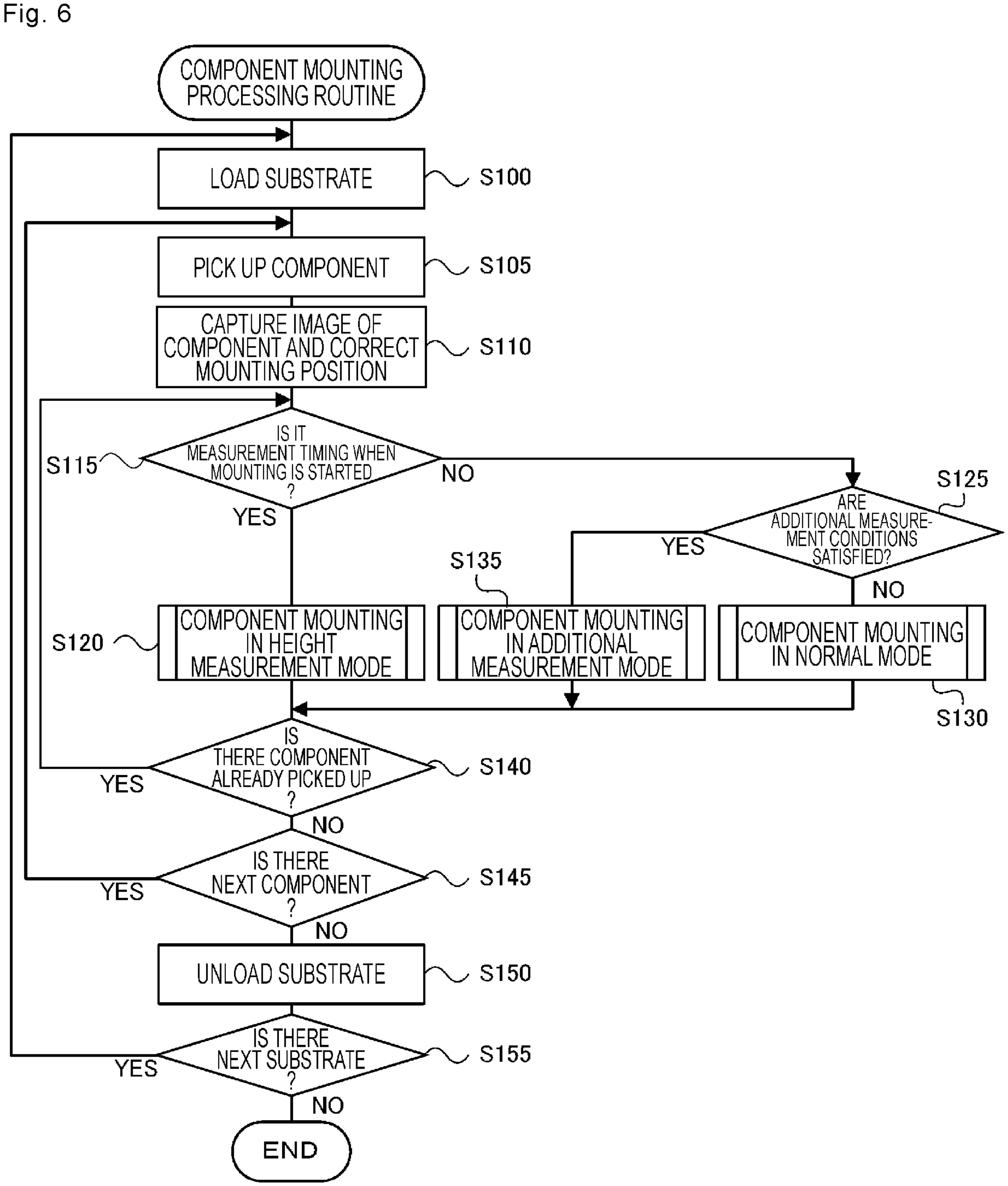
FIG. 6 is a flowchart illustrating an example of a component mounting processing routine.

Next, in mounting apparatus 10 configured as described above, an operation of picking up the component by mounting head 40 and mounting the component on substrate S will be described. FIG. 6 is a flowchart illustrating an example of a component mounting processing routine, and is executed by, for example, CPU 101 received a job from a management device (not illustrated). The job includes various types of information such as the type and order of mounting components to be mounted on substrate S, the number of pieces of substrate S to be manufactured, the component size such as the component height of the component to be mounted, the mounting position, the size such as the thickness of substrate S, the height of the upper surface (mounting surface) in design, and the like.

When the component mounting processing routine is started, CPU 101 causes substrate conveyance device 14 to carry in and hold substrate S (S100), and causes suction nozzle of mounting head 40 to pick up the components supplied to the supply position by feeding out the tape from component supply device 16 (S105). Next, CPU 101 causes mounting head 40 to move on part camera 26, causes part camera 26 to capture an image of the component picked up by each suction nozzle 60, and processes the image to correct the mounting position of the component so that the positional deviation or the like of the component is eliminated (S110).

Subsequently, CPU 101 determines whether it is a timing at which the height of the substrate is measured when the mounting on substrate S is started (measurement timing when the mounting is started) (S115). When it is determined that the measurement timing is when the mounting is started, CPU 101 performs the component mounting in the height measurement mode for mounting the component while measuring the height of the substrate, which is the height of the upper surface of substrate S (S120). In addition, when it is determined that it is not the measurement timing when the mounting is started, CPU 101 determines whether additional measurement conditions for performing the additional measurement of the height of the substrate are satisfied during the mounting of the component on substrate S (S125), and when it is determined that the additional measurement conditions are satisfied, the component mounting in the additional measurement mode is performed (S135). On the other hand, when it is determined that the additional measurement conditions are not satisfied in S125, CPU 101 performs component mounting in the normal mode in which the component is mounted as usual without measuring the height of the substrate (S130). Details of each processing of component mounting and additional measurement conditions will be described later.

When component mounting is performed in S120, S130, and S135, CPU 101 determines whether there is another component already picked up by each suction nozzle 60 of mounting head 40 (S140), and when it is determined that there is another component, CPU 101 returns to S115 to perform processing. In the present embodiment, from when the mounting of one substrate S is started until when the mounting of a predetermined number of components of three or more is completed, it is determined in S115 that it is the measurement timing when the mounting is started, and the component mounting in the height measurement mode is performed in S120. In addition, when it is determined in S140 that there are no components picked up by each suction nozzle 60 of mounting head 40, CPU 101 determines whether there is a next component to be mounted on substrate S (S145), and when it is determined that there is the next component, CPU 101 returns to S105 to perform the processing. On the other hand, when it is determined that there is no next component, CPU 101 causes substrate conveyance device 14 to release the holding of substrate S and unload substrate S (S150) and determines whether there is next substrate S (S155). When it is determined that there is next substrate S, CPU 101 returns to S100 to perform the processing. When it is determined that there is no next substrate S, CPU 101 completes the processing.

Figure 7:
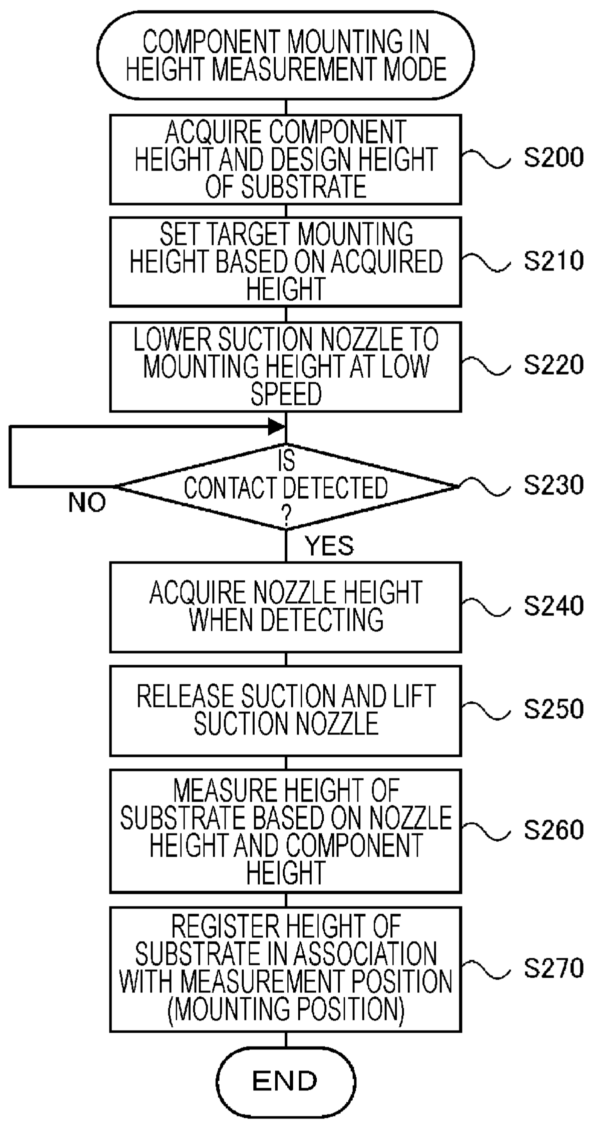
FIG. 7 is a flowchart illustrating an example of component mounting in a height measurement mode.
Figure 8:
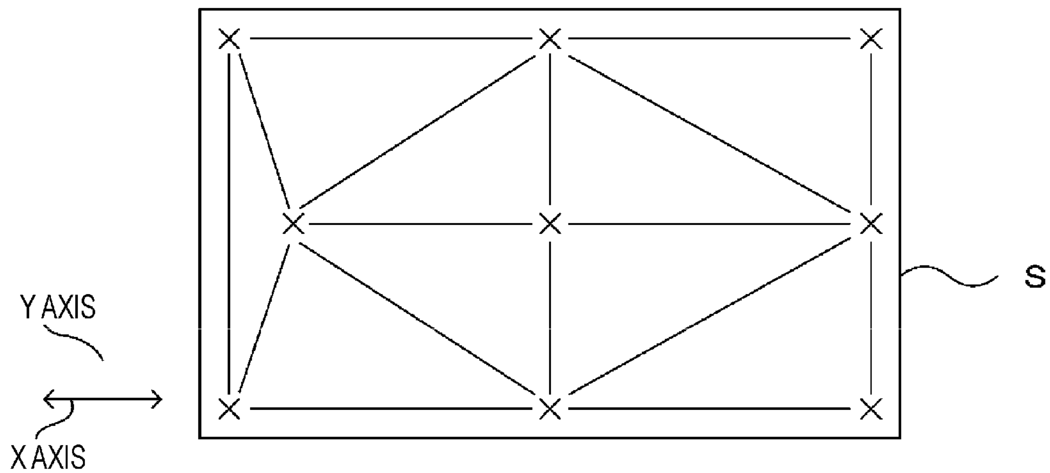
FIG. 8 is an explanatory diagram illustrating an example of a measurement position of a height of a substrate.

FIG. 7 is a flowchart illustrating an example of component mounting in a height measurement mode, and FIG. 8 is an explanatory diagram illustrating an example of a measurement position of the height of the substrate. First, CPU 101 acquires the component height (thickness) of the component picked up by suction nozzle 60 and the design height of the substrate of substrate S from the job (S200), and sets the target mounting height when the component is mounted based on the acquired height of the substrate (S210). The information on the component height is not limited to the height acquired from the job. For example, in a case where mounting head 40 is provided with a side camera capable of capturing an image of a side surface of the component picked up by suction nozzle 60, CPU 101 may process an image of the side camera to acquire the component height. Next, CPU 101 causes suction nozzle 60 to be lowered to the mounting height at the low speed lower than the normal speed described later in the component mounting in the normal mode (S220), and waits for detecting contact with substrate S (S230). In S230, the contact between the component picked up by suction nozzle 60 and substrate S is detected based on the detection signal from flow rate sensor 92 as described above.

When the contact is detected in S230, CPU 101 acquires a tip end position of suction nozzle 60 as the nozzle height from the position of Z-axis slider 52 detected by Z-axis position sensor 53 (S240). In addition, CPU 101 releases the suction of the component and causes suction nozzle 60 to be lifted (S250), so that the component is mounted on substrate S. Next, CPU 101 measures the height of the substrate based on the acquired nozzle height and the component height of the mounted component (S260). CPU 101 sets the height derived by subtracting the component height from the nozzle height as the height of the substrate. CPU 101 registers the height of the substrate in HDD 103 or the like in association with the measurement position of the height of the substrate, that is, the mounting position (XY position) of the component (S270), and completes the present processing.

Here, the mounting positions of the predetermined number of components are determined to be three or more positions including multiple points as close to the outer edge as possible and at least one point as close to the center of the upper surface of the rectangular substrate S as possible. In the present embodiment, as indicated by an x-mark in FIG. 8, the mounting positions are determined so as to be lattice point positions that partition the upper surface of the substrate in a lattice shape, such as a position in the vicinity of the four corners, a position in a midpoint in the vicinity of the four corners or slightly deviated from a midpoint, and a position in the center of the substrate. For example, mounting positions of nine points are determined at three points in each of the X-axis direction and the Y-axis direction. The mounting position is not limited to nine points, may be a total of 25 points or the like at five points in each of the X-axis direction and the Y-axis direction, and may be determined at the mounting position closest to the x-mark when there is no position corresponding to the position of the x-mark. In addition, the lattice points may be determined at positions where the intervals in each of the X-axis direction and the Y-axis direction are appropriately changed in accordance with the size of the substrate. In addition, in the job, the mounting order is determined so as to mount the components at these mounting positions first. As described above, since the mounting positions of a predetermined number of components are determined as the measurement positions of the height of the substrate, the height of the substrate can be measured from substrate S without deviation while reducing the number of components to be mounted in the height measurement mode.

Figure 9:
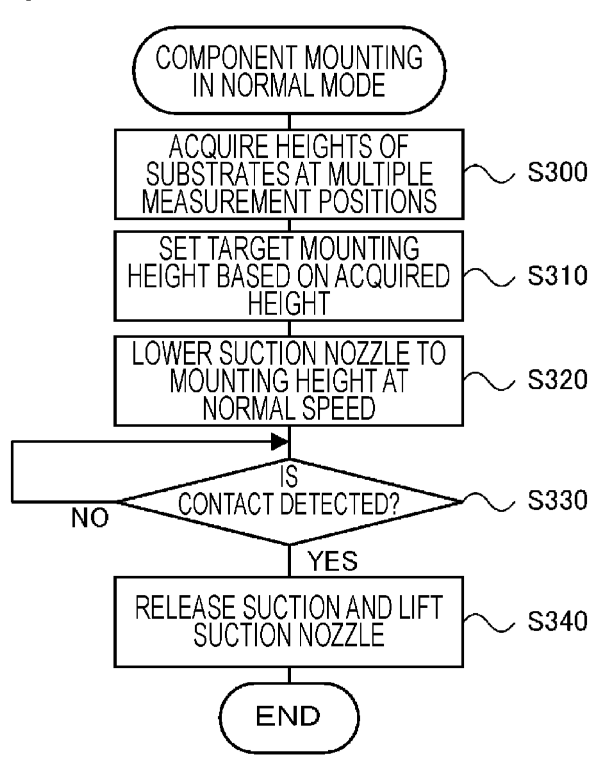
FIG. 9 is a flowchart illustrating an example of component mounting in a normal mode.

FIG. 9 is a flowchart illustrating an example of component mounting in the normal mode. First, CPU 101 acquires multiple heights of the substrates from HDD 103 or the like based on a target mounting position in the XY-axis direction of a component picked up by suction nozzle 60 (S300). In S300, at least three heights of the substrates are acquired in order from the closest distance between the target mounting position and the measurement position associated with the height of the substrate. Next, CPU 101 creates a virtual plane based on the acquired height of the substrate, and sets a target mounting height by correcting the mounting height of the component instructed by the job based on the virtual plane (S310).

Figure 10:
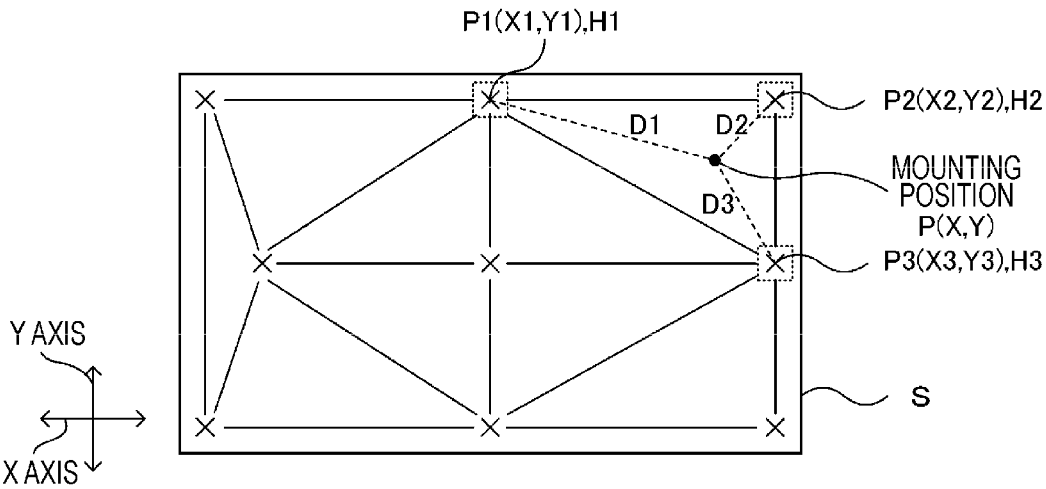
FIG. 10 is an explanatory diagram illustrating an example of a state where a mounting height is set.

For example, CPU 101 acquires the height of the substrates of three points in the vicinity of the mounting position as multiple positions, obtains a virtual plane passing through the three points based on the height of the substrates and the measurement positions of the three points by a well-known technique, and derives the height of the substrate at the mounting position of the component from the virtual plane. FIG. 10 is an explanatory diagram illustrating an example of a state where a mounting height is set. In this example, the height of the substrate at the mounting position of the component is derived by obtaining a virtual plane using the height of the substrate measured by the three x-marks (P1, P2, P3) surrounded by a rectangular frame with respect to mounting position P (X, Y) indicated by black circles. That is, the height of the substrate of mounting position P (X, Y) is derived by obtaining a virtual plane using height H1, H2, and H3 of the substrates of each of measurement positions P1 (X1, Y1), P2 (X2, Y2), and P3 (X3, Y3) of the three points, and the mounting height is set. Such a method is described in, for example, JP-A-2009-27015, and thus a description thereof will be omitted. In addition, the height of the substrate of the mounting position may be derived from not only three points in the vicinity but also a virtual plane including other points. For example, all the measured measurement positions (9 points in FIG. 10, 25 points described above, and the like) may be used. In such a case, it may be created using an inverse distance weighting method or the like in which the reciprocal of the distance from the mounting position of the component is used as a weight coefficient. Needless to say, an inverse distance weighting method or the like may be used when the height of the substrate of the mounting position is derived from the height of the substrates of three points.

In a case where the inverse distance weighting method is used in the example of FIG. 10, CPU 101 calculates distances D1, D2, and D3 between mounting position P and each of measurement positions P1, P2, and P3, and calculates weighting coefficients α1, α2, and α3 by dividing each of the distances by the total distances by the following equations (1) to (3). CPU 101 calculates height H of the substrate of mounting position P by multiplying each of heights H1, H2, and H3 of the substrates of measurement positions P1, P2, and P3 by weight coefficients α1, α2, and α3 by the following equation (4). As described above, CPU 101 may calculate height H of the substrate by multiplying each of heights H1 to Hn of the substrates of n points including points other than the three points in the vicinity by weight coefficients α1 to αn of the inverse distance weighting method. In addition, there may be a case where the height of the substrate of mounting position P outside the measurement position (lattice point) is derived due to a constraint on the mounting order of the components or the like. Even in this case, CPU 101 can derive the height of the substrate of the mounting position using the inverse distance weighting method. That is, CPU 101 may derive the height of the substrate by the inverse distance weighting method for the mounting position outside the lattice, and may derive the height of the substrate by the virtual plane or the like for the mounting position inside the lattice.

$$\alpha 1 = D1/(D1+D2+D3) \quad (1)$$

$$\alpha 2 = D2/(D1+D2+D3) \quad (2)$$

$$\alpha 3 = D3/(D1+D2+D3) \quad (3)$$

$$H = \alpha 1 * H1 + \alpha 2 * H2 + \alpha 3 * H3 \quad (4)$$

Here, in a case where the actual height of the substrate is higher than that of the design, the load on the component when mounting may be increased, so that there is a possibility that the component may be broken. In the present embodiment, since the height of the substrate of the mounting position can be obtained from the measurement result of the height of the substrate and corrected so that the mounting height is increased, it is possible to prevent such a possibility. In addition, in a case where the actual height of the substrate is lower than that of the design, the component does not correctly come into contact with the upper surface of substrate S, and there is a possibility that a mounting failure such as positional deviation or missing may occur, or a contact detection error may occur. In the present embodiment, since the height of the substrate of the mounting position can be obtained from the measurement result of the height of the substrate and corrected so that the component height is decreased, it is possible to prevent such a possibility. As described above, even when the actual height of the substrate differs from that of the design due to the warpage or the like of substrate S, CPU 101 can appropriately set the mounting height of the component.

Next, CPU 101 causes suction nozzle 60 to be lowered to a target mounting height at the normal speed (S320) and waits to detect contact with substrate S (S330). When contact with substrate S is detected in S330, CPU 101 releases the suction of the component and causes suction nozzle 60 to be lifted (S340), so that the component is mounted on substrate S and the present processing is completed.

When the component is mounted in such a normal mode, CPU 101 may determine that additional measurement conditions are satisfied in S125. The additional measurement conditions may be conditions that are satisfied in a case where a component in the vicinity of a predetermined component is mounted before the mounting of the predetermined component such as a component likely to be broken or a component requiring high accuracy, for example. In addition, the additional measurement conditions may be another condition, such as conditions satisfied every time the number of components to be mounted reaches a certain number, or conditions satisfied when an operator instructs the additional measurements using an operation panel (not illustrated). In addition, whether to perform additional measurement may be settable by the operator using an operation panel or the like.

Figure 11:
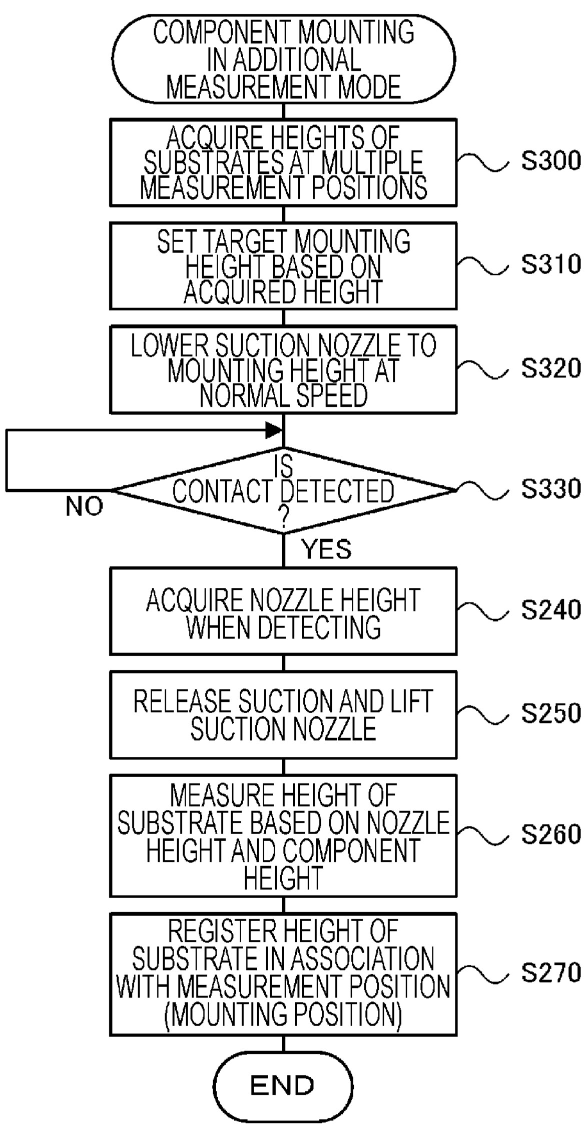
FIG. 11 is a flowchart illustrating an example of component mounting in an additional measurement mode.

FIG. 11 is a flowchart illustrating an example of component mounting in the additional measurement mode. First, CPU 101 executes the processing of S300 to S330 in the same manner as the component mounting in the normal mode. That is, CPU 101 sets the mounting height of the component in accordance with the measured height of the substrate, causes suction nozzle 60 to be lowered to the mounting height at the normal speed, and waits to detect contact with substrate S. Next, CPU 101 executes the processing of S240 to S270 in the same manner as the component mounting in the height measurement mode. That is, the height of the substrate is measured based on the nozzle height and the component height when contact with substrate S is detected, and registered in association with the measurement position (mounting position). As described above, in the additional measurement mode, since suction nozzle 60 is lowered at the normal speed based on the measured height of the substrate, it is possible to suppress a decrease in efficiency due to time-consuming lowering. In addition, since the number of measurement points of the height of the substrate can be increased, it is possible to further improve the setting accuracy of the mounting height in the subsequent mounting processing. For example, since CPU 101 additionally measures the height of the substrate when the component in the vicinity of the predetermined component described above is mounted, it is possible to acquire the height of the substrate at a position closer to the predetermined component, and the mounting height when the predetermined component is mounted can be accurately set. Accordingly, mounting apparatus 10 can more appropriately mount the predetermined component.

Here, a correspondence between the elements of the present embodiment and the elements of the present disclosure will be clarified. Mounting apparatus 10 of the present embodiment corresponds to the mounting apparatus of the present disclosure, suction nozzle 60 corresponds to the holding member, lifting and lowering device 50 corresponds to the lifting and lowering device, flow rate sensor 92 corresponds to the contact detection section, and control device 100 corresponds to the control section. In the present embodiment, an example of the method for measuring the height of the substrate and the mounting method of the present disclosure is clarified by describing the operation of control device 100.

In mounting apparatus 10 of the present embodiment described above, suction nozzle 60 is lowered to acquire the nozzle height when contact with substrate S is detected, and the height of the substrate is measured based on the nozzle height and the component height. As a result, the height of the substrate can be accurately measured without being affected by the reflection of light or the like. In addition, since it is not necessary to add a dedicated sensor for measuring the height of the substrate, it is possible to suppress an increase in cost.

In addition, in mounting apparatus 10, component mounting (measurement mounting processing) in the height measurement mode is performed from the start of mounting to a predetermined number of components, and component mounting (normal mounting processing) in the normal mode is performed after the predetermined number of components are mounted. Therefore, it is unnecessary to secure a time for height measurement before starting the mounting on substrate S, so that the mounting of the component can be promptly started. In addition, by measuring the height of the substrate during mounting, it is possible to suppress delay in the mounting processing.

In addition, in mounting apparatus 10, suction nozzle 60 is lowered at the normal speed in the component mounting in the normal mode, and suction nozzle 60 is lowered at the low speed lower than the normal speed in the component mounting in the height measuring mode. Therefore, in a state where the height of the substrate is not measured, it is possible to prevent the component from vigorously colliding with substrate S due to warpage or the like of substrate S and breaking the component.

In addition, in mounting apparatus 10, since the component mounting (measurement mounting processing) in the additional measurement mode is performed even after a predetermined number of components are mounted when the additional measurement conditions are satisfied, it is possible to increase the measurement position of the height of the substrate and improve the setting accuracy of the mounting height.

In addition, in mounting apparatus 10, since the mounting positions of a predetermined number of components are determined at lattice point positions that partition the upper surface of substrate S in a lattice shape, it is possible to acquire the height of the substrate without deviation and appropriately set the mounting height of the components while reducing the predetermined number as much as possible.

It goes without saying that the present disclosure is not limited to the above-described embodiments, and may be implemented in various aspects as long as it belongs to the technical scope of the present disclosure.

In the above embodiment, the component mounting in the additional measurement mode is performed in S135 in a case where the additional measurement conditions of the height of the substrate are satisfied in S125 of the component mounting processing routine; however, the configuration is not limited to this. For example, S135 may be omitted, and in a case where the additional measurement conditions of the height of the substrate are satisfied, component mounting in the height measurement mode of S120 may be performed. In this case, when the height of the substrate is measured, suction nozzle 60 is normally lowered at the low speed. In addition, the measurement is not limited to the one for performing the additional measurement of the height of the substrate, and the additional measurement need not be performed by omitting S125.

In the above embodiment, suction nozzle 60 is lowered at a lower speed than the normal mode in the height measurement mode, however, the configuration is not limited to this, and suction nozzle 60 may be lowered at the same normal speed as the normal mode. Alternatively, the mounting of several components may be performed at low speed from the start of the height measurement mode, and the mounting of the remaining components may be performed at normal speed until a predetermined number of components is reached.

In the above embodiment, the mounting positions of the predetermined number of components to be mounted in the height measurement mode are positioned as lattice points, however, the configuration is not limited to this. The mounting position may be any position that partitions the upper surface of the substrate into multiple regions and may be, for example, staggered positions.

Figures 12, 13:
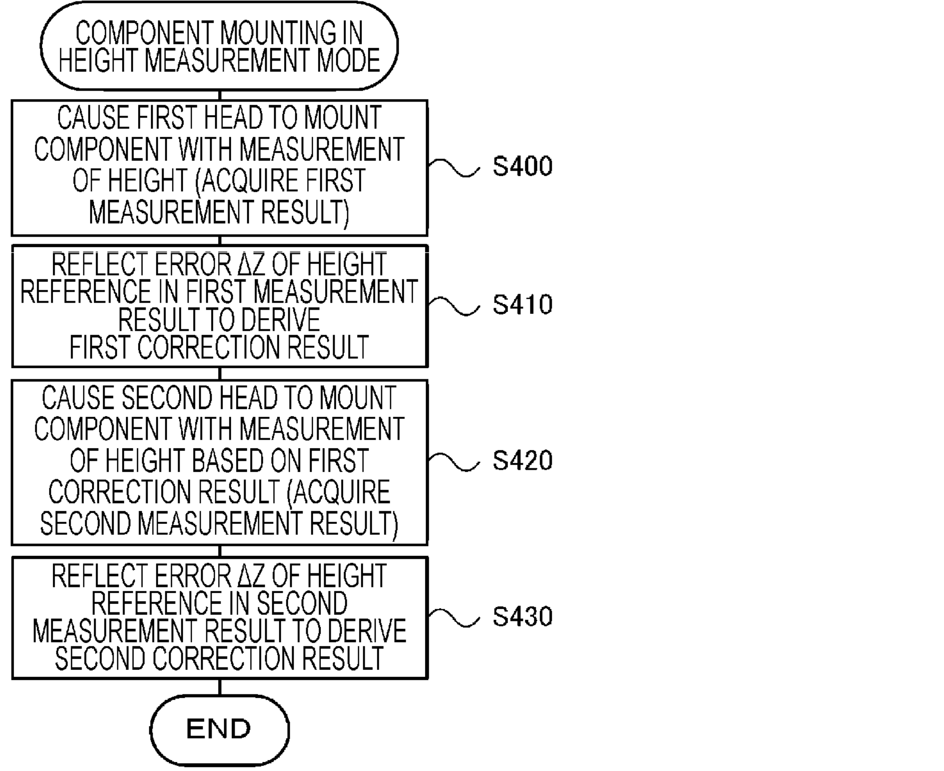
FIG. 12 is a configuration diagram schematically illustrating a configuration of mounting apparatus 10A of a modification example.
FIG. 13 is a flowchart illustrating component mounting in a height measurement mode of the modification example.

In the above embodiment, mounting apparatus 10 may be configured as follows. FIG. 12 is a configuration diagram schematically illustrating a configuration of mounting apparatus 10A of a modification example. Mounting apparatus 10A is provided with first mounting unit 11A on the front side and second mounting unit 11B on the rear side. In the modification example, the same reference numerals are assigned to the same components as those of the embodiment, and detailed descriptions thereof will be omitted. First mounting unit 11A is provided with substrate conveyance device 14, component supply device 16, part camera 26, mark camera 28, first mounting head 40A, and the like. Similarly, second mounting unit 11B is provided with substrate conveyance device 14, component supply device 16, part camera 26, mark camera 28, second mounting head 40B, and the like. That is, first mounting unit 11A and second mounting unit 11B have similar configurations. In addition, both first mounting head 40A and second mounting head 40B are configured in the same manner as mounting head 40. That is, first mounting head 40A is provided with multiple first suction nozzles 60A (first holding members) and first lifting and lowering device 50A for lifting and lowering first suction nozzles 60A, as well as a sensor for detecting contact between first suction nozzles 60A and substrate S, sensor for detecting the height of first suction nozzles 60A, and the like. In addition, second mounting head 40B is provided with multiple second suction nozzles 60B (second holding members) and second lifting and lowering device 50B for lifting and lowering second suction nozzles 60B, as well as a sensor for detecting contact between second suction nozzles 60B and substrate S, a sensor for detecting the height of second suction nozzles 60B, and the like. Height reference Z0 (1) of first lifting and lowering device 50A is defined, for example, on the upper surface of the conveyor frame of substrate conveyance device 14 on the front side, and height reference Z0 (2) of second lifting and lowering device 50B is defined, for example, on the upper surface of the conveyor frame of substrate conveyance device 14 on the rear side. Although both height references Z0 (1) and Z0 (2) are the same height in design, slight error AZ may occur due to assembly error or dimensional error of the conveyor frame.

In mounting apparatus 10A, first mounting unit 11A picks up the component supplied from component supply device 16 on the front side by first suction nozzle 60A, and mounts the component on substrate S conveyed by substrate conveyance device 14 on the front side or substrate conveyance device 14 on the rear side. In addition, second mounting unit 11B picks up the component supplied from component supply device 16 on the rear side by second suction nozzle 60B, and mounts the component on substrate S conveyed by substrate conveyance device 14 on the front side or substrate conveyance device 14 on the rear side. The content of the present disclosure can be applied to mounting apparatus 10A having such a configuration to measure the height of the substrate. FIG. 13 is a flowchart illustrating component mounting in the height measurement mode of the modification example. First, CPU 101 of control device 100 of mounting apparatus 10A causes first mounting head 40A to acquire the first measurement result so that first mounting head 40A mounts the component with the measurement of the height of the substrate with respect to substrate S conveyed by substrate conveyance device 14 on the front side or rear side (S400). That is, CPU 101 measures the height of the substrate based on the height of first suction nozzle 60A and the component height when contact with substrate S is detected by lowering first suction nozzle 60A by first lifting and lowering device 50A, and acquires the first measurement result associated with the measurement position. For example, in S400, the height of the substrate is measured while mounting a part of the components of the predetermined number of components described above.

Next, CPU 101 reflects error AZ of height reference Z0 described above in the first measurement result to derive a first correction result (S410). The first correction result is derived to use the height of the substrate of the first measurement result for controlling second mounting head 40B (second lifting and lowering device 50B). Control device 100 controls second mounting head 40B (second lifting and lowering device 50B) based on the first correction result, and controls second mounting head 40B so that second mounting head 40B mounts the component with the measurement of the height of the substrate to acquire the second measurement result (S420). Subsequently, control device 100 reflects error AZ in the second measurement result to derive a second correction result (S430), and completes the present processing. The second correction result is derived to use the height of the substrate of the second measurement result for controlling first mounting head 40A (first lifting and lowering device 50A). In S420, CPU 101 measures the height of the substrate based on the height of second suction nozzle 60B and the component height when contact with substrate S is detected by lowering second suction nozzle by second lifting and lowering device 50B, and acquires the second measurement result associated with the measurement position. For example, in S420, the height of the substrate is measured while mounting the remaining components excluding a part of the components described above of the predetermined number. CPU 101 may return to S400 again to measure the height of the substrate in accordance with the predetermined number of times. For example, in a case where the predetermined number is value 25 (25 locations), CPU 101 may measure the height of the substrates of, for example, 10 locations in S400, measure the height of the substrates of, for example, 10 locations in S420, and return to S400 again to measure the height of the substrates at remaining five locations. At this time, control device 100 may control first mounting head 40A (first lifting and lowering device 50A) based on the height of the substrate as the first measurement result and the height of the substrate as the second correction result.

Figure 14:
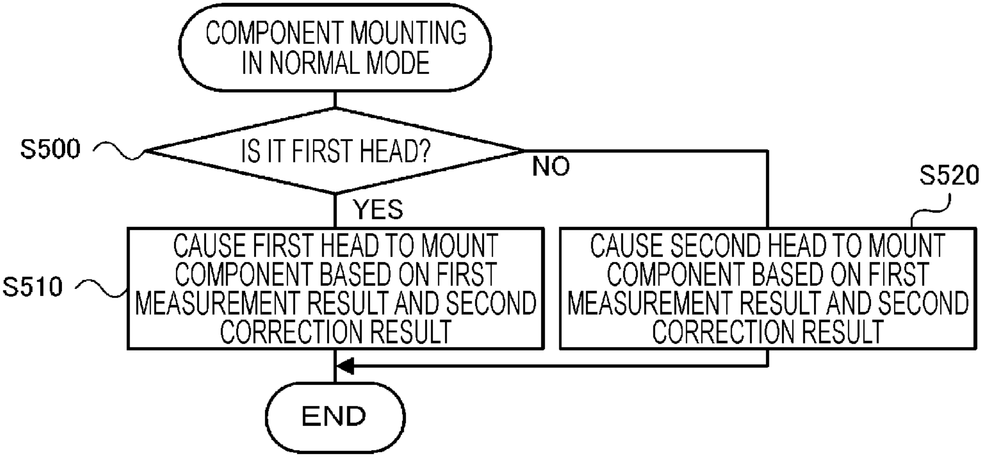
FIG. 14 is a flowchart illustrating component mounting in a normal mode of the modification example.

In addition, FIG. 14 is a flowchart illustrating component mounting in the normal mode of the modification example. CPU 101 determines whether the component is mounted by first mounting head 40A (S500). When it is determined that the component is mounted by first mounting head 40A, CPU 101 causes first lifting and lowering device 50A of first mounting head 40A to control the lowering of first suction nozzle 60A based on the first measurement result and the second correction result to mount the component (S510). Since the details of the component mounting are the same as those of the processing in FIG. 9, a description thereof will be omitted. In addition, when it is determined that the component is not mounted by first mounting head 40A, that is, the component is mounted by second mounting head 40B in S500, control device 100 causes second lifting and lowering device 50B of second mounting head 40B to control the lowering of second suction nozzle 60B based on the first correction result and the second measurement result to mount the component (S520). As described above, in the modification example, since the height of the substrate is measured using each of first mounting head 40A (first lifting and lowering device 50A) and second mounting head 40B (second lifting and lowering device 50B), the height of the substrate can be efficiently measured. In addition, since first mounting head 40A and second mounting head 40B perform component mounting using each of the measurement results and the correction result in which error AZ is reflected in the measurement result of the opposite side, the components can be appropriately mounted by efficiently using the measurement results of both heads. Mounting apparatus 10A may have a configuration in which at least first mounting head 40A is provided with a sensor for detecting contact between first suction nozzle 60A and substrate S, and the first measurement result can be corrected and used by second mounting head 40B (second lifting and lowering device 50B).

Figure 15:
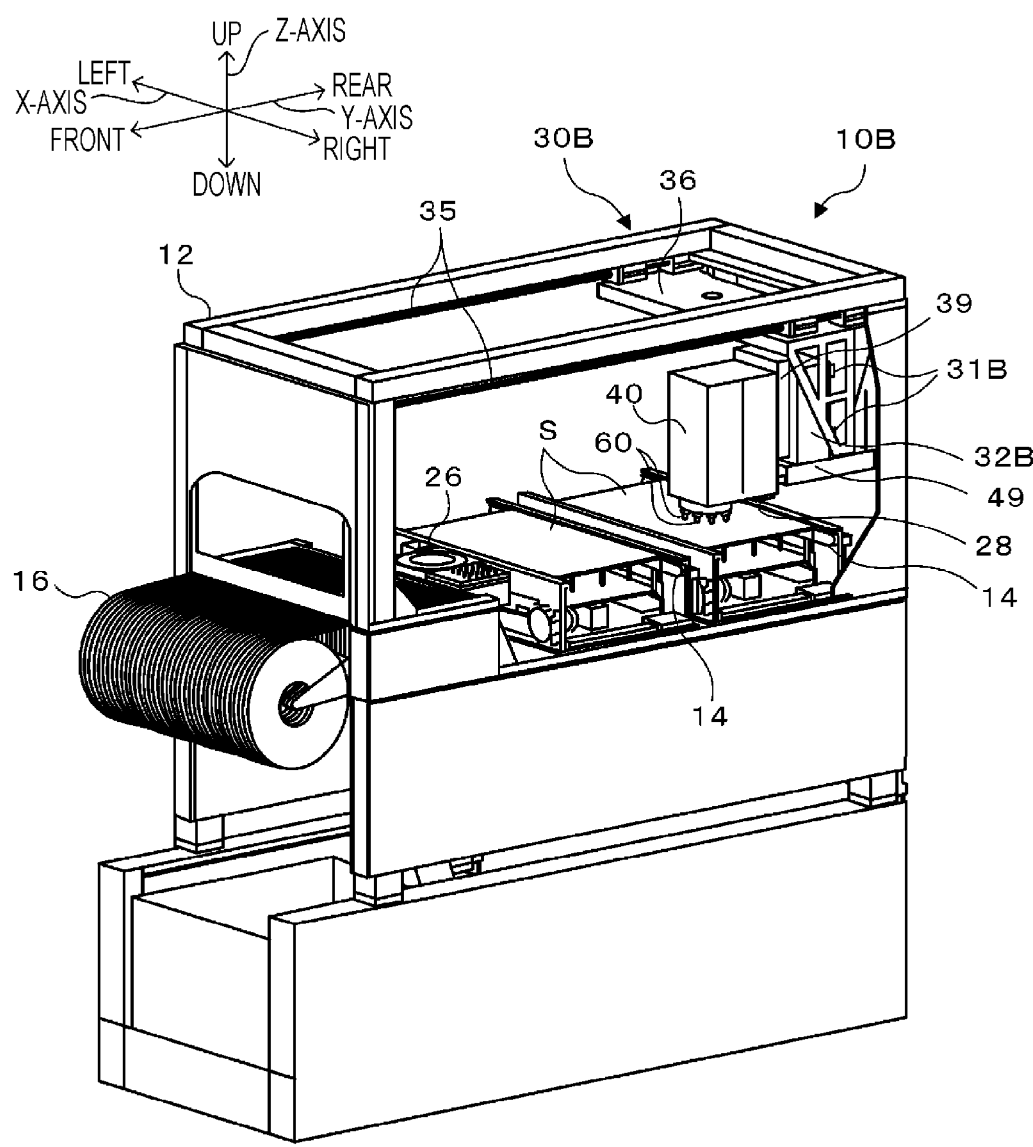
FIG. 15 is a configuration diagram schematically illustrating a configuration of mounting apparatus 10B of a modification example.

In addition, mounting apparatus 10 may be configured as follows. FIG. 15 is a configuration diagram schematically illustrating a configuration of mounting apparatus 10B of the modification example, and FIG. 16 is an explanatory diagram illustrating a position of mounting head 40 of mounting apparatus 10B in the up-down direction. In mounting apparatus 10B, XY robot 30B is provided with X-axis slider 32B, Y-axis slider 36, and Z-axis slider 39. X-axis slider 32B is attached to X-axis guide rail 31B provided on a front surface of Y-axis slider 36. Z-axis slider 39 is slidably attached to Z-axis guide rail 39*a* attached to the front surface of X-axis slider 32B and extending in the up-down direction, and moves in the up-down direction by driving a Z-axis motor (not illustrated). In mounting apparatus 10B, mounting head 40 is attached to Z-axis slider 39. In addition, case 49 extending rearward from a lower portion of Z-axis slider 39 to below X-axis slider 32B and reaching a rear portion of Y-axis slider 36 is attached to Z-axis slider 39. Case 49 accommodates wirings, pipe, and the like of devices mounted on X-axis slider 32B and Z-axis slider 39, and moves together with Z-axis slider 39.

Figure 16A:
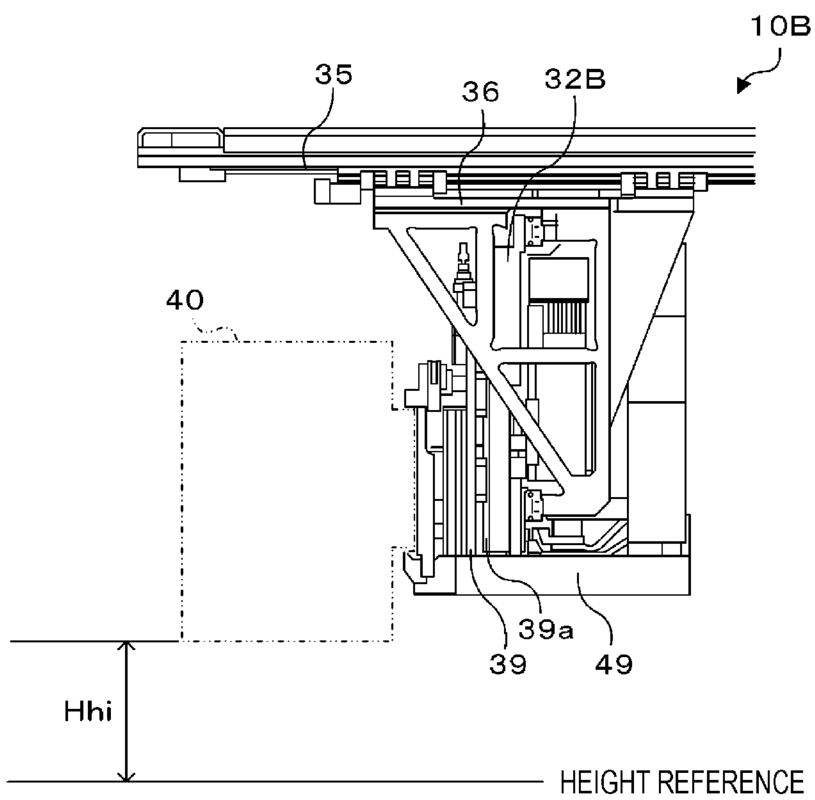
FIG. 16 is an explanatory diagram illustrating a position of mounting head 40 of mounting apparatus 10B in the up-down direction.
Figure 16B:
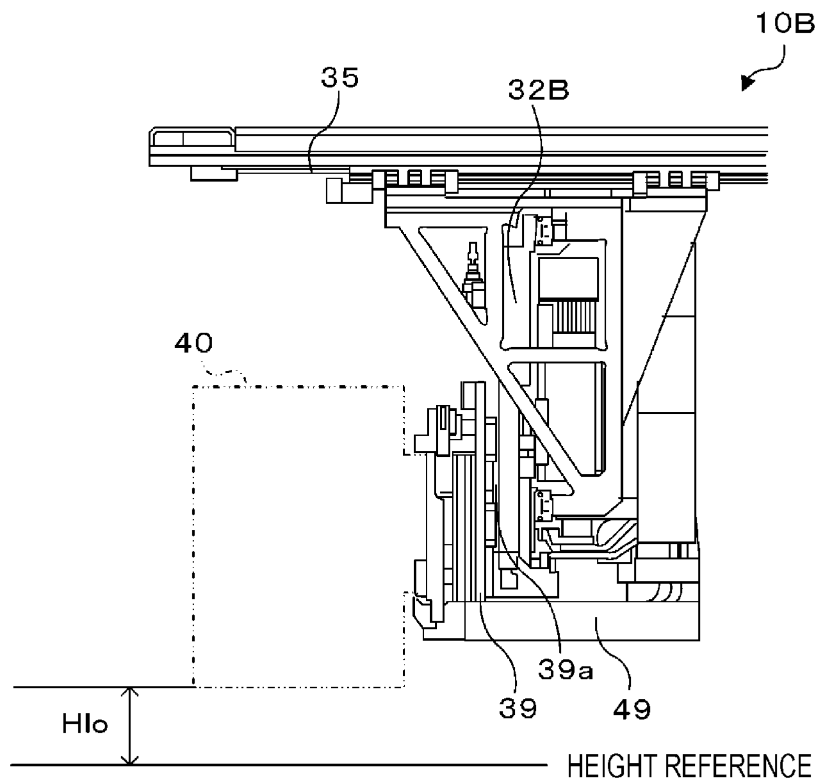

In mounting apparatus 10A, in a case where Z-axis slider 39 is in the normal position (upper position), the height from the predetermined height reference to the lower surface of mounting head 40 is set to Hhi, as illustrated in FIG. 16A. In addition, in a case where control device 100 drives and causes the Z-axis motor to move Z-axis slider 39 to a lower position than the normal position, the height from the height reference to the lower surface of mounting head 40 is set to Hlo, as illustrated in FIG. 16B. The content of the present disclosure can be applied to mounting apparatus 10B having such a configuration to measure the height of the substrate. That is, in each of the states where mounting head 40 is at the normal position and where mounting head 40 is at the lower position, the height of the substrate can be measured based on the nozzle height and the component height when suction nozzle 60 is lowered and contact with substrate S is detected. In a case where mounting head 40 is at the lower position, since the arrival position when suction nozzle 60 is lowered is lower than in a case where mounting head 40 is at the normal position, it is possible to expand the range in which the height of the substrate can be measured.

In the above embodiment, the height of the substrate is measured by lowering suction nozzle 60 to which the component is picked up, however, the configuration is not limited to this, and the height of the substrate may be measured by so-called idle mounting in which the height of the substrate is measured by lowering suction nozzle 60 to which the component is not picked up. In this case, before substrate S is carried in and the mounting of the component is started, suction nozzle 60 to which the component is not picked up may be lowered, and the height of the substrate may be measured based on the nozzle height when contact with substrate S is detected. In addition, the predetermined number of measurement positions may be the same positions as the mounting positions of the components, and it is preferable to be the positions where solders or the like are not provided. In addition, the processing for measuring the height of the substrate with suction nozzle 60 to which the component is not picked up may be performed during the mounting processing. That is, before the mounting of the component picked up by each suction nozzle 60 is completed and mounting head 40 starts to move to component supply device 16 side in order to pick up the next component, suction nozzle 60 may be lowered and the height measurement may be additionally performed.

In the above embodiment, the lifting and lowering position at which lifting and lowering device 50 raises and lowers suction nozzle 60 (nozzle holder 70) is defined as one location, however, the configuration is not limited to this, and two or more lifting and lowering devices 50 operating independently of each other may be provided so that suction nozzle 60 can be raised and lowered at lifting and lowering positions of two or more location. According to such a configuration, the height of the substrate can be promptly measured and collected. In addition, it is also possible to additionally measure the height of the substrate by lowering suction nozzle 60 to which the component is not picked up using second lifting and lowering device 50 while mounting the component by component mounting by suction nozzle 60 in the normal mode using first lifting and lowering device 50.

In a mounting line in which multiple mounting apparatuses 10 of the above embodiment are disposed side by side along the conveyance direction of the substrate, the measurement result of the height of the substrate may be used as follows. For example, the measurement result of the height of the substrate measured by at least one mounting apparatus 10 on the upstream side in the conveyance direction may be output to mounting apparatus 10 on the downstream side, and mounting apparatus 10 on the downstream side may mount the component on substrate S based on the measurement result. That is, the measurement result of the height of the substrate measured by mounting apparatus 10 on the upstream side may be shared and used by mounting apparatus 10 on the downstream side. In addition, a region for measuring the height of the substrate may be allocated to several mounting apparatus 10, and information on the height of the substrate in the entire region of substrate S may be created from the measurement result of each mounting apparatus 10.

In the above embodiment, flow rate sensor 92 detects the flow rate of the air flowing through second air passage 75*a* to detect the contact between suction nozzle 60 (component) and substrate S, however, the configuration is not limited to this, and the contact may be detected by detecting at least one of the flow rate and the pressure.

Here, the mounting apparatus of the present disclosure may be configured as follows. For example, in the mounting apparatus of the present disclosure, the control section may execute measurement mounting processing that releases the holding of the component to mount the component when the contact is detected and measures the height of the substrate based on the height of the holding member and a height of the component, from when the mounting of the components on the substrate is started until when a predetermined number of components of three or more are mounted, and may execute normal mounting processing that sets the mounting height in accordance with the height of the substrate measured for the predetermined number of components and mounts remaining components on the substrate based on the mounting height after the measurement mounting processing is completed. As a result, it is unnecessary to secure a time for height measurement before starting the mounting, so that the mounting of the component can be promptly started. In addition, since the measurement mounting processing is executed from the start of the mounting to a predetermined number of components, and thereafter, the normal mounting processing is executed, it is possible to suppress the delay of the mounting processing by measuring the height of the substrate during the mounting.

In the mounting apparatus of the present disclosure, the control section may cause the holding member to be lowered at a normal speed in the normal mounting processing, and cause the holding member to be lowered at a low speed lower than the normal speed in the measurement mounting processing. As a result, it is possible to prevent components from vigorously colliding with the substrate due to warpage or the like of the substrate in a state where the actual height of the substrate is not acquired.

In the mounting apparatus of the present disclosure, the control section may execute the measurement mounting processing in place of the normal mounting processing in a case where predetermined height measurement conditions are satisfied even after the measurement mounting processing is completed. As a result, it is possible to increase the number of measurement points of the height of the substrate and improve the setting accuracy of the mounting height.

In the mounting apparatus of the present disclosure, each mounting position of the predetermined number of components may be determined at a position as a lattice point partitioning an upper surface of the substrate in a lattice shape. As a result, it is possible to appropriately set the mounting height of the component while reducing the predetermined number as much as possible.

A mounting method of the present disclosure is a mounting method of mounting a component on a substrate, the method including a contact detecting step of detecting contact between a component held by a holding member and the substrate, a measurement mounting step of releasing holding of the component to mount the component when the contact is detected by the contact detecting step and measuring a height of the substrate based on a height of the holding member and a height of the component, from when mounting of the components on the substrate is started until when a predetermined number of components of three or more are mounted, and a normal mounting step of setting a mounting height of the component in accordance with the height of the substrate measured for the predetermined number of components, and mounting remaining components on the substrate based on the mounting height after the measurement mounting step is completed.

A method for measuring a height of a substrate of the present disclosure in a mounting apparatus that includes a lifting and lowering device configured to lift and lower a holding member holding a component with respect to the substrate, and a contact detection section configured to detect contact between the holding member or a component held by the holding member and the substrate, in which a mounting height of the component is set in accordance with a height of the substrate, the holding member holding the component is lowered to the mounting height by the lifting and lowering device, and holding of the component is released to mount the component when the contact is detected, the method including acquiring a height of the holding member when the holding member is lowered by the lifting and lowering device and the contact is detected, and measuring the height of the substrate based on the height of the holding member.

In the mounting method and the method for measuring the height of the substrate of the present disclosure, the height of the substrate can be accurately measured without being affected by the reflection of light or the like, similar to the mounting apparatus described above. In addition, since it is not necessary to add a dedicated detection section for measuring the height of the substrate, it is possible to suppress an increase in cost. In the mounting method and the method for measuring the height of the substrate, various aspects of the mounting apparatus described above may be adopted, or steps for realizing the functions of the mounting apparatus described above may be added.

INDUSTRIAL APPLICABILITY

The present disclosure can be applied to a mounting apparatus for mounting a component on a substrate.

REFERENCE SIGNS LIST

10, 10A, 10B mounting apparatus, 11A first mounting unit, 11B second mounting unit, 12 main body frame, 14 substrate conveyance device, 16 component supply device, 26 part camera, 28 mark camera, 30, 30B XY robot, 31, 31B X-axis guide rail, 32, 32B X-axis slider, 33 X-axis motor, 34 X-axis position sensor, 35 Y-axis guide rail, 36 Y-axis slider, 37 Y-axis motor, 38 Y-axis position sensor, 39 Z-axis slider, 39*a* Z-axis guide rail, 40 mounting head, first mounting head, 40B second mounting head, 41 frame, 42 head main body, 42*a* shaft section, 42*b* holder holding portion, 43 gear, 44 R-axis motor, 45 gear, 46 Q-axis motor, 47 gear, 49 case, 50 lifting and lowering device, 50A first lifting and lowering device, 50B second lifting and lowering device, 51 linear motor, 52 Z-axis slider, 52*a* engaging section, 53 Z-axis position sensor, 60 suction nozzle, 60A first suction nozzle, 60B second suction nozzle, 61 nozzle section, 61*a* internal passage, 61*b* through-hole, 61*c* long hole, 62 retaining ring, 63 pin, 70 nozzle holder, gear, 70*b* upper end portion, 71 spring, 72 outer cylinder, 72*a* first air passage, 72*b* leak hole, 73 pressing ring, 74 spring, 75 inner cylinder, 75*a* second air passage, 75*b* flange section, 75*c* through-hole, 75*d* opening, 76 spring, 77 valve, 77*a* through-hole, 77*b* communicating hole, 80 negative pressure supply device, 81 negative pressure source, 83 negative pressure introduction passage, 85 atmosphere introduction passage, 87 switching valve, 88 spool, 89 spool driving mechanism, 90 positive pressure supply device, 91 positive pressure source, 92 flow rate sensor, 93 positive pressure introduction passage, 100 control device, 101 CPU, 102 ROM, 103 HDD, 104 RAM, 105 input and output interface, 106 bus, S substrate

The invention claimed is:

1. A mounting apparatus comprising:

a lifting and lowering device configured to lift and lower a nozzle holder that holds a holding member holding a component with respect to a substrate, the nozzle holder including an air passage inside the nozzle holder, a cylindrical switching valve comprising a communicating hole that communicates outside of the nozzle holder;

a contact detection section configured to detect contact between the holding member or a component held by the holding member and the substrate by detecting a change in an air flow rate due to movement of the cylindrical switching valve causing the air passage to communicate with the outside of the nozzle holder via the communicating hole; and processing circuitry configured to set a mounting height of the component in accordance with a height of the substrate, cause the holding member holding the component to be lowered to the mounting height by the lifting and lowering device, release holding of the component to mount the component when the contact is detected, and acquire a height of the holding member when the holding member is lowered by the lifting and lowering device and the contact is detected, and measures the height of the substrate based on the height of the holding member.

2. The mounting apparatus according to claim 1, wherein the processing circuitry is configured to execute measurement mounting processing that releases the holding of the component to mount the component when the contact is detected and measures the height of the substrate based on the height of the holding member and a height of the component, from when mounting of the components on the substrate is started until when a predetermined number of components of three or more are mounted, and execute normal mounting processing that sets the mounting height in accordance with the height of the substrate measured for the predetermined number of components and mounts remaining components on the substrate based on the mounting height after the measurement mounting processing is completed.

3. The mounting apparatus according to claim 2, wherein the processing circuitry is configured to cause the holding member to be lowered at a normal speed in the normal mounting processing, and causes the holding member to be lowered at a low speed lower than the normal speed in the measurement mounting processing.

4. The mounting apparatus according to claim 2, wherein the processing circuitry is configured to execute the measurement mounting processing in a case where predetermined height measurement conditions are satisfied.

5. The mounting apparatus according to claim 2, wherein each mounting position of the predetermined number of components is determined at a position as a lattice point partitioning an upper surface of the substrate in a lattice shape.

6. The mounting apparatus according to claim 1, further comprising:

a first lifting and lowering device configured to lift and lower a first holding member holding the component with respect to the substrate; and a second lifting and lowering device configured to lift and lower a second holding member holding the component with respect to the substrate, wherein the contact detection section detects contact between the first holding member or a component held by the first holding member and the substrate, and the processing circuitry is configured to acquire a height of the first holding member when the first holding member is lowered by the first lifting and lowering device and the contact is detected by the contact detection section, and control lifting and lowering of the second holding member by the second lifting and lowering device based on the height of the first holding member.

7. A mounting method of mounting a component on a substrate, the method comprising:

a contact detecting step of detecting contact between a component held by a holding member and the substrate, the holding member being held by a nozzle holder that includes an air passage inside the nozzle holder, a cylindrical switching valve comprising a communicating hole that communicates outside of the nozzle holder, the contact detected by a change in an air flow rate due to movement of the cylindrical switching valve causing the air passage to communicate with the outside of the nozzle holder via the communicating hole;

a measurement mounting step of releasing holding of the component to mount the component when the contact is detected by the contact detecting step and measuring a height of the substrate based on a height of the holding member and a height of the component, from when mounting of the components on the substrate is started until when a predetermined number of components of three or more are mounted; and a normal mounting step of setting a mounting height of the component in accordance with the height of the substrate measured for the predetermined number of components, and mounting remaining components on the substrate based on the mounting height after the measurement mounting step is completed.

8. A method for measuring a height of a substrate in a mounting apparatus that includes a lifting and lowering device configured to lift and lower a nozzle holder that holds a holding member holding a component with respect to the substrate, the nozzle holder including an air passage inside the nozzle holder, a cylindrical switching valve comprising a communicating hole that communicates outside of the nozzle holder, and a contact detection section configured to detect contact between the holding member or a component held by the holding member and the substrate, in which a mounting height of the component is set in accordance with a height of the substrate, the holding member holding the component is lowered to the mounting height by the lifting and lowering device, and holding of the component is released to mount the component when the contact is detected, the method comprising:

acquiring a height of the holding member when the holding member is lowered by the lifting and lowering device and the contact is detected by detecting a change in an air flow rate due to movement of the cylindrical switching valve causing the air passage to communicate with the outside of the nozzle holder via the communicating hole, and measuring the height of the substrate based on the height of the holding member.

* * * * *